United States Patent
Li et al.

(10) Patent No.: US 8,560,929 B2
(45) Date of Patent: Oct. 15, 2013

(54) SYSTEMS AND METHODS FOR NON-BINARY DECODING

(75) Inventors: Zongwang Li, San Jose, CA (US); Wu Chang, Santa Clara, CA (US); Chung-Li Wang, San Jose, CA (US); Changyou Xu, Fremont, CA (US); Shaohua Yang, San Jose, CA (US); Yang Han, Sunnyvale, CA (US)

(73) Assignee: LSI Corporation, San Jose, CA (US)

(*) Notice: Subject to any disclaimer, the term of this patent is extended or adjusted under 35 U.S.C. 154(b) by 145 days.

(21) Appl. No.: 13/167,764

(22) Filed: Jun. 24, 2011

(65) Prior Publication Data

US 2012/0331370 A1  Dec. 27, 2012

(51) Int. Cl.
*H03M 13/00* (2006.01)

(52) U.S. Cl.
USPC .................................................... 714/795

(58) Field of Classification Search
USPC ................. 714/795, 776, 755, 801, 702, 778; 375/262, 341
See application file for complete search history.

(56) References Cited

U.S. PATENT DOCUMENTS

| | | | |
|---|---|---|---|
| 5,278,703 A | 1/1994 | Rub et al. |
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |

(Continued)

FOREIGN PATENT DOCUMENTS

| | | |
|---|---|---|
| EP | 1814108 | 8/2007 |
| WO | WO 2006/134527 | 12/2006 |
| WO | 2010/101578 | 9/2010 |

OTHER PUBLICATIONS

U.S. Appl. No. 11/461,026, filed Jul. 31, 2006, Tan, Weijun.

(Continued)

*Primary Examiner* — Phung M Chung
(74) *Attorney, Agent, or Firm* — Hamilton DeSanctis & Cha

(57) ABSTRACT

Various embodiments of the present invention provide systems and methods for data processing. A data processing circuit is disclosed that includes: a data detector circuit, a first symbol constrained arrangement circuit, and a second symbol constrained arrangement circuit. The data detector circuit is operable to apply a data detection algorithm to a combination of a first input data set and a decoded data set to yield a detected output that includes a number of non-binary symbols. The first symbol constrained arrangement circuit is operable to receive the detected output and to re-arrange the detected output in accordance with a first arrangement algorithm to yield a re-arranged output. The bits for at least one non-binary symbol from the detected output are maintained together in the re-arranged output. The second symbol constrained arrangement circuit is operable to receive a second input data set and to re-arrange the second data input in accordance with a second arrangement algorithm to yield the decoded data set. The bits for at least one non-binary symbol from the second input data set are maintained together in the decoded data set output.

20 Claims, 11 Drawing Sheets

(56) References Cited

U.S. PATENT DOCUMENTS

| | | |
|---|---|---|
| 5,768,044 A | 6/1998 | Hetzler |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Katawani et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greeberg et al. |
| 7,093,179 B2 | 8/2006 | Shea |
| 7,113,356 B1 | 9/2006 | Wu |
| 7,136,244 B1 | 11/2006 | Rothbert |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,587,657 B2 | 9/2009 | Haratsch |
| 7,590,168 B2 | 9/2009 | Raghaven et al. |
| 7,590,927 B1 | 9/2009 | Shih et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong et al. |
| 7,801,200 B2 | 9/2010 | Tan |
| 7,802,163 B2 | 9/2010 | Tan |
| 8,161,357 B2 * | 4/2012 | Tan et al. ............ 714/780 |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Elefeheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.

(56) References Cited

OTHER PUBLICATIONS

U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System Architectures: Synergies with Solid-State Disks" Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

\* cited by examiner

SYSTEMS AND METHODS FOR NON-BINARY DECODING

BACKGROUND OF THE INVENTION

The present inventions are related to systems and methods for data processing, and more particularly to non-binary based data decoding.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In such systems, errors are introduced to the data during the transmission and recovery processes. In some cases, such errors can be detected by applying encoding/decoding techniques such as low density parity check encoding/decoding. In some cases such encoding/decoding techniques may require complex and bandwidth intense functionality.

Hence, there exists a need in the art for advanced systems and methods for error correction in data processing systems.

BRIEF SUMMARY OF THE INVENTION

The present inventions are related to systems and methods for data processing, and more particularly to non-binary based data decoding.

Various embodiments of the present invention provide data processing circuits that include: a data detector circuit, a first symbol constrained arrangement circuit, and a second symbol constrained arrangement circuit. The data detector circuit is operable to apply a data detection algorithm to a combination of a first input data set and a decoded data set to yield a detected output that includes a number of non-binary symbols. The first symbol constrained arrangement circuit is operable to receive the detected output and to re-arrange the detected output in accordance with a first arrangement algorithm to yield a re-arranged output. The bits for at least one non-binary symbol from the detected output are maintained together in the re-arranged output. The second symbol constrained arrangement circuit is operable to receive a second input data set and to re-arrange the second data input in accordance with a second arrangement algorithm to yield the decoded data set. The bits for at least one non-binary symbol from the second input data set are maintained together in the decoded data set output.

In some instances of the aforementioned embodiments, the circuit is implemented as part of an integrated circuit. In various instances of the aforementioned embodiments, the circuit is implemented as part of a storage device, or a wireless data transfer device. In some particular cases, the aforementioned storage device is a hard disk drive.

In one or more instances of the aforementioned embodiments, the first arrangement algorithm is the inverse of the second arrangement algorithm. In various instances of the aforementioned embodiments, the first arrangement algorithm is the inverse of a third arrangement algorithm applied to yield the first input data set. In some cases, the data detection algorithm may be, but is not limited to, a Viterbi algorithm data detection algorithm, or a maximum a posteriori data detection algorithm.

In some instances of the aforementioned embodiments, the circuit further includes a data decoder circuit that is operable to apply a data decoding algorithm to the re-arranged output to yield the second input data set. In some such instances, the data decoding algorithm is a non-binary data decoding algorithm tailored for the non-binary symbols. These non-binary symbols may be two or more bits each.

Other embodiments of the present invention provide methods for data processing that include: receiving a first data input having at least a first non-binary symbol; receiving a second data input having at least a second non-binary symbol that corresponds to the first non-binary symbol; re-arranging the second data input according to a second arrangement algorithm to yield a decoded data set such that the bits of the second non-binary symbol are placed together in the decoded data set; applying a data detection algorithm to the first data input and the decoded data set to yield a detected output that includes the first non-binary symbol; and re-arranging the detected output according to a first arrangement algorithm to yield a re-arranged output such that the bits of the first non-binary symbol are placed together in the re-arranged output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to non-binary based data decoding.

Various embodiments of the present invention provide for non-binary symbol based data processing. In some cases, the data processing includes shuffling or otherwise re-arranging transfer data using a symbol constrained approach. Such a symbol constrained shuffling approach may provide enhanced error recovery performance when compared with bit level shuffling approaches. In various cases, a reduced format data transfer may be employed that yields a reduced circuit area when compared with non-reduced format approaches. Based upon the disclosure provided herein, one of ordinary skill in the art will recognize a variety of advantages in addition to or alternative to those discussed herein.

Figure 1:
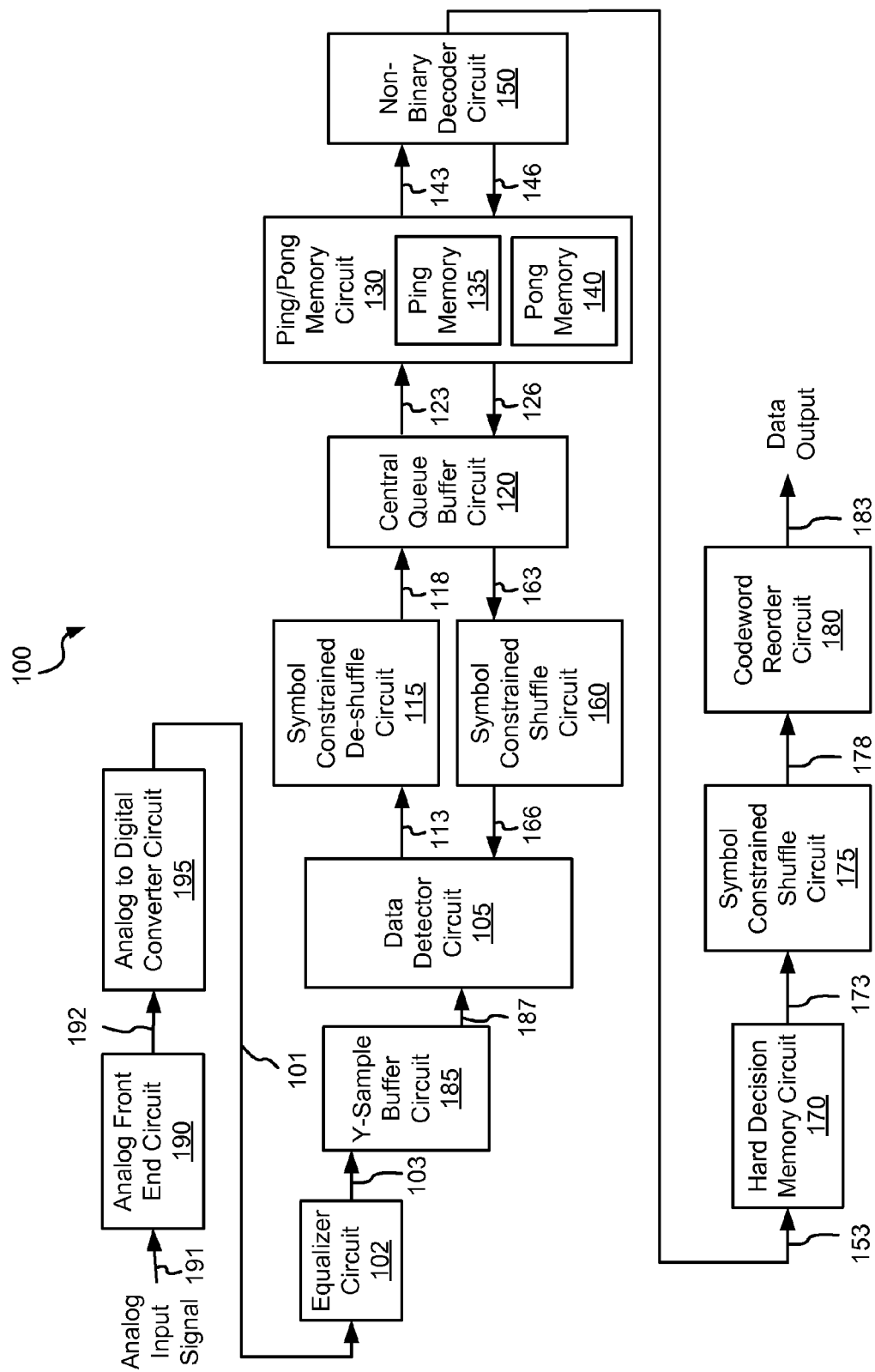
FIG. 1 depicts a data processing circuit including a non-binary decoder circuit in accordance with one or more embodiments of the present invention.

Turning to FIG. 1, a data processing circuit 100 including a non-binary decoder circuit 150 is shown in accordance with one or more embodiments of the present invention. Data processing circuit 100 includes an analog front end circuit 190 that receives an analog input 191. Analog input 191 may be received, for example, from a read/write head assembly (not shown) disposed in relation to a storage medium (not shown). As another example, analog input 191 may be received from a transmission medium (not shown) via a receiver (not shown). Based upon the disclosure provided herein, one of ordinary skill in the art will recognize a variety of sources of analog input 191.

Prior to transmission or writing to a storage medium or to a transmission medium (collectively referred to as a "channel"), the data represented by analog input 191 was shuffled. Such shuffling involves rearranging the order of an encoded data set. In transferring data across a channel there is a possibility that local regions of the data will become corrupt due to, for example, electronics noise and/or media defects. Such localized corruption is often referred to as burst errors. By shuffling the data, the effects of localized data corruption can be spread across a wider range of the data set increasing the possibility that the error correction capability in data processing circuit 100 can recover the data set affected by the localized corruption. Said another way, burst errors corrupt a large number of successive bits that without adjustment may overwhelm a downstream data processing circuit. It has been determined that non-binary symbols included within a data set also provide a valuable tool in mitigating the effects of localized data corruption. Thus, in some embodiments of the present invention, the shuffling is done on a non-binary symbol by symbol basis (i.e., the integrity of the non-binary symbols within the data set is maintained by assuring that bits corresponding to the same symbol are not separated during the shuffling process). Such an approach maintains the symbol integrity of the shuffled data, allowing data detector circuit 105 to rely on the symbols to enhance error recovery.

Figure 6:
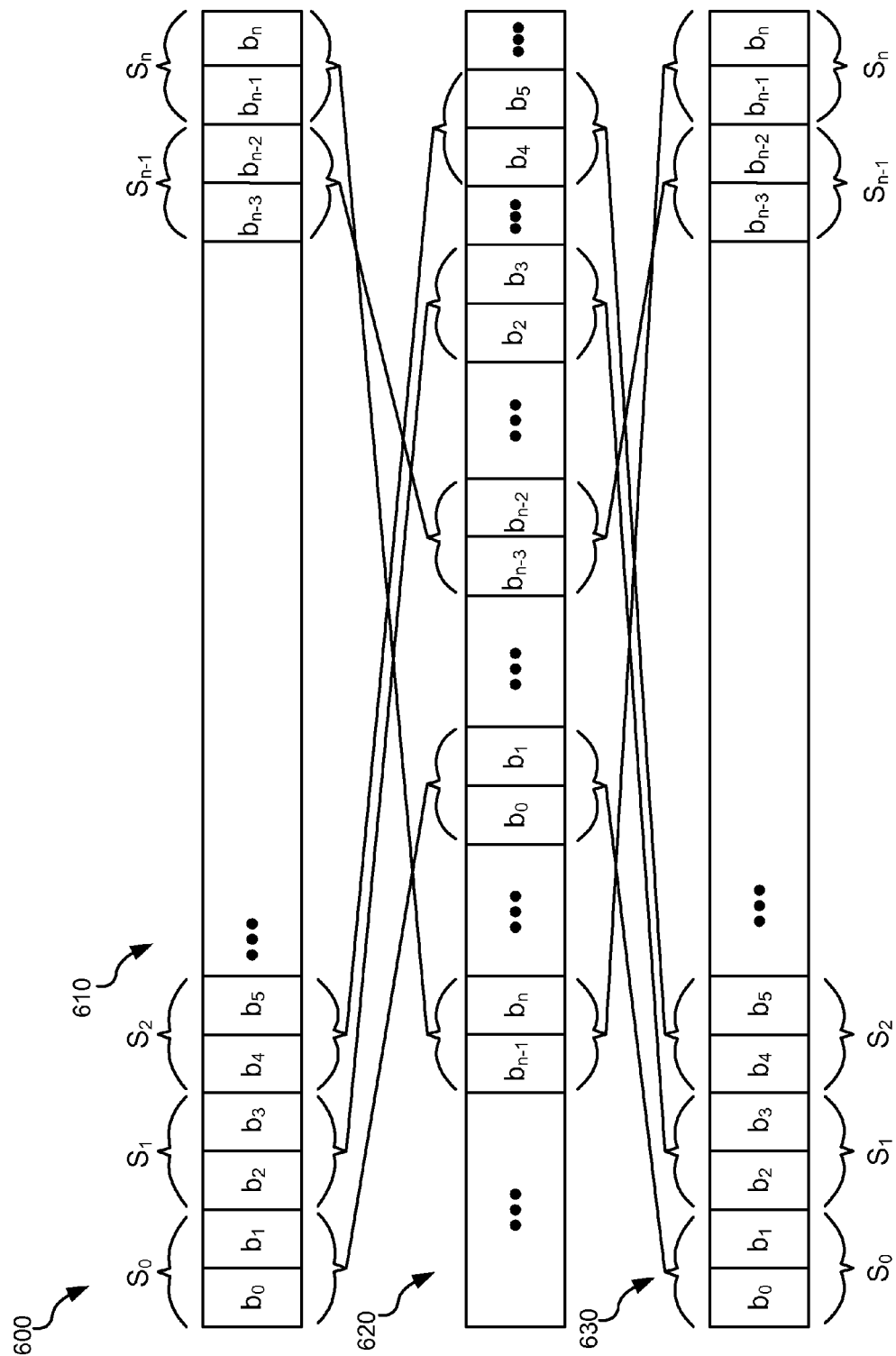
FIG. 6 graphically depicts an example reduced data transfer input and output process for a two bit symbol.
Figure 7:
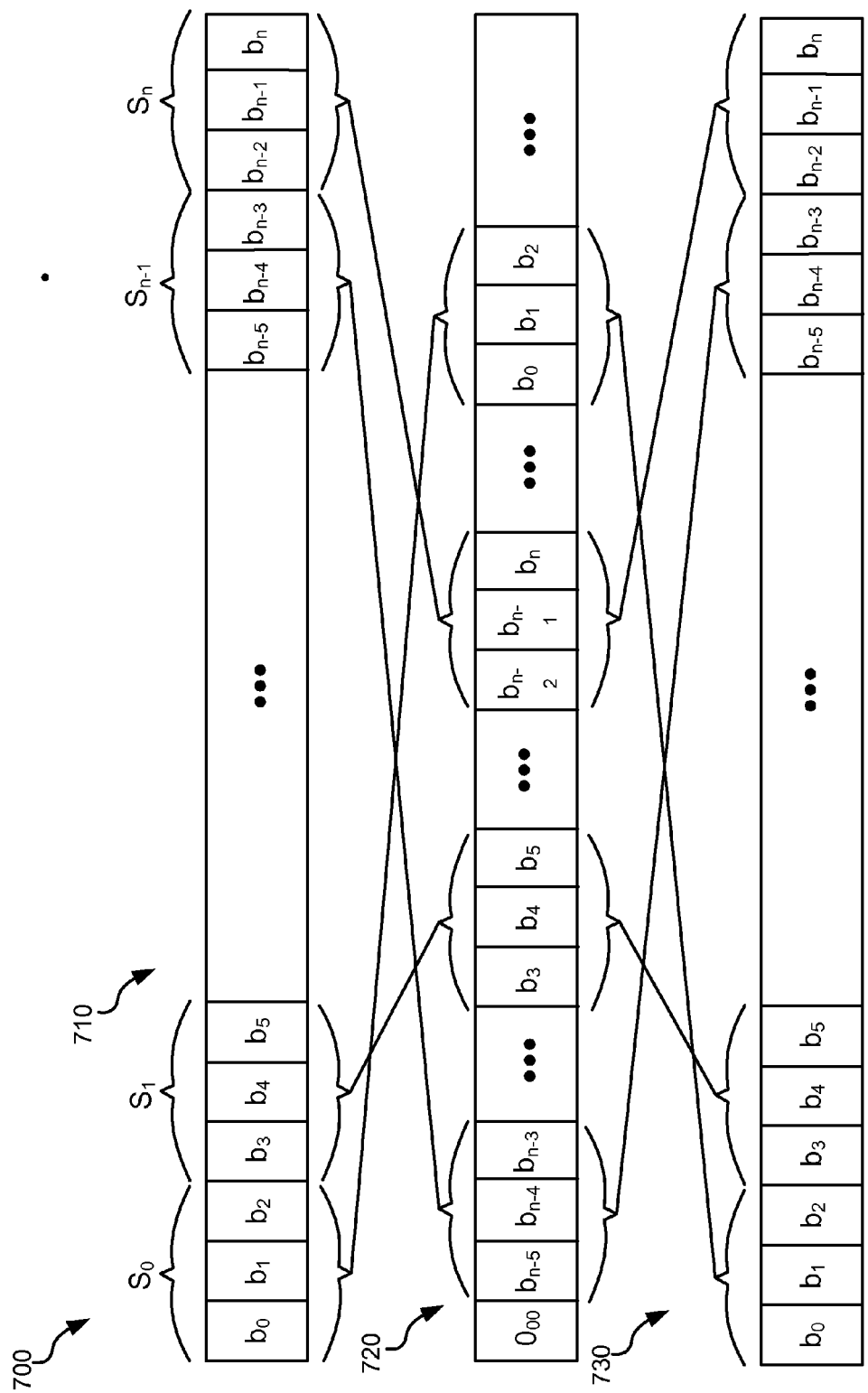
FIG. 7 graphically depicts an example reduced data transfer input and output process for a three bit symbol.

Examples of such symbol constrained shuffling are graphically presented in relation to FIGS. 6-7. Turning to FIG. 6, a graphic 600 depicts an example of the symbol constrained shuffle process. In particular, a non-shuffled data set 610 includes a number of binary values ($b_0$, $b_1$, $b_2$, $b_3$, $b_4$, $b_5$ ... $b_{n-3}$, $b_{n-2}$, $b_{n-1}$, $b_n$). In some cases, non-shuffled data set 610 includes between five hundred and several thousand data bits. In this example, the bits are assembled into two bit symbols ($S_0$, $S_1$, $S_2$ ... $S_{n-1}$, $S_n$). A shuffled data set 620 is shown where bits corresponding to the respective two bit symbols are rearranged without separating the bits within the symbols. In particular, bits $b_{n-1}$, $b_n$ corresponding to symbol $S_n$ are maintained together but moved to a different location in the data set, bits $b_0$, $b_1$ corresponding to symbol $S_0$ are maintained together but moved to a different location in the data set, bits $b_0$, $b_1$ corresponding to symbol $S_0$ are maintained together but moved to a different location in the data set, bits $b_{n-3}$, $b_{n-2}$ corresponding to symbol $S_{n-1}$ are maintained together but moved to a different location in the data set, bits $b_2$, $b_3$ corresponding to symbol $S_1$ are maintained together but moved to a different location in the data set, and bits $b_4$, $b_5$ corresponding to symbol $S_2$ are maintained together but moved to a different location in the data set.

Turning to FIG. 7, a graphic 700 depicts an example of the symbol constrained shuffle process. In particular, a non-shuffled data set 710 includes a number of binary values ($b_0$, $b_1$, $b_2$, $b_3$, $b_4$, $b_5$ ... $b_{n-5}$, $b_{n-4}$, $b_{n-3}$, $b_{n-2}$, $b_{n-1}$, $b_n$). Again, in some cases non-shuffled data set 710 includes between five hundred and several thousand data bits. In this example, the bits are assembled into three bit symbols ($S_0$, $S_1$ ... $S_{n-1}$, $S_n$). A shuffled data set 720 is shown where bits corresponding to the symbols are rearranged without separating the three bit symbols. In particular, bits $b_{n-5}$, $b_{n-4}$, $b_{n-3}$ corresponding to symbol $S_{n-1}$ are maintained together but moved to a different location in the data set, bits $b_3$, $b_4$, $b_5$ corresponding to symbol $S_1$ are maintained together but moved to a different location in the data set, bits $b_{n-2}$, $b_{n-1}$, $b_n$ corresponding to symbol $S_n$ are maintained together but moved to a different location in the data set, and bits $b_0$, $b_1$, $b_2$ corresponding to symbol $S_1$ are maintained together but moved to a different location in the data set. Of note, while FIGS. 6-7 show examples using two bit and three bit, respectively, other symbol lengths are possible.

Referring again to FIG. 1, analog front end circuit 190 processes analog input 191 and provides a processed analog signal 192 to an analog to digital converter circuit 195. Analog front end circuit 190 may include, but is not limited to, an analog filter and an amplifier circuit as are known in the art. Based upon the disclosure provided herein, one of ordinary skill in the art will recognize a variety of circuitry that may be included as part of analog front end circuit 190. An analog to digital converter circuit 195 converts processed analog signal 192 into a corresponding series of digital samples 101. Analog to digital converter circuit 195 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 101 are provided to an equalizer circuit 102 that provides an equalized output 103. In some embodiments of the present invention, equalizer circuit 102 is a digital finite impulse response (DIFR) circuit as are known in the art. Based upon the disclosure provided herein, one of ordinary skill in the art will recognize a variety of equalizer circuits that may be used in relation to different embodiments of the present invention. Equalized output 103 is stored in a Y-sample buffer circuit 185 that maintains a number of data sets allowing for multiple global iterations passing the given data set through a data detector circuit 105 and non-binary data decoder circuit 150. The size of Y-sample buffer circuit 185 may be selected to provide sufficient buffering such that a data set received as equalized output 103 remains available at least until a first iteration processing of that same data set is complete and the processed data is available in a central queue buffer circuit 120 as more fully described below. Y-sample buffer circuit 185 provides the data sets 187 to data detector circuit 105.

Data detector circuit 105 may be any data detector circuit known in the art. For example, in some embodiments of the present invention, data detector circuit 105 is a Viterbi algorithm data detector circuit. As another example, in some embodiments of the present invention, data detector circuit 105 is a maximum a posteriori data detector circuit. Based upon the disclosure provided herein, one of ordinary skill in the art will recognize a variety of data detection algorithms that may be implemented by data detector circuit 105. In some particular embodiments of the present invention, data detector circuit 105 may be a format enhanced data detecting circuit as discussed in relation to FIG. 2 below. Data detector circuit provides a detected output 113 that corresponds to the received data input.

Detected output 113 is provided to a symbol constrained de-shuffle circuit 115 that applies a de-shuffling algorithm to detected output 113 to yield a de-shuffled output 118. The shuffling algorithm applied by symbol constrained de-shuffle circuit 115 is the reverse of that applied to the encoded data set incorporated in analog input 191. In particular, the integrity of the symbols included within the data set was maintained in the shuffling process and is also maintained in the de-shuffling process. An example of the de-shuffling process applied by de-shuffle circuit 115 is depicted in FIGS. 6-7. In particular, referring to FIG. 6, shuffled data set 620 is translated to a de-shuffled data set 630 where symbol $S_0$ is returned to its original position with bits $b_0$, $b_1$ maintained together; symbol $S_1$ is returned to its original position with bits $b_2$, $b_3$ maintained together; symbol $S_3$ is returned to its original position with bits $b_4$, $b_5$ maintained together; symbol $S_{n-1}$ is returned to its original position with bits $b_{n-3}$, $b_{n-2}$ maintained together; and symbol $S_n$ is returned to its original position with bits $b_{n-1}$, $b_n$ maintained together. Similarly, referring to FIG. 7, shuffled data set 720 is translated to a de-shuffled data set 730 where symbol $S_0$ is returned to its original position with bits $b_0$, $b_1$, $b_2$ maintained together; symbol $S_1$ is returned to its original position with bits $b_3$, $b_4$, $b_5$ maintained together; symbol $S_{n-1}$ is returned to its original position with bits $b_{n-5}$, $b_{n-4}$, $b_{n-3}$ maintained together; symbol $S_n$ is returned to its original position with bits $b_{n-2}$, $b_{n-1}$, $b_n$ maintained together.

De-shuffled output 118 is stored to a central queue buffer circuit 120 where it awaits processing by a non-binary decoder circuit 150. Central queue buffer circuit 120 is a storage circuit capable of maintaining data sets provided by data detector circuit 105 and data sets provided by non-binary decoder circuit 150. In some cases, central queue buffer circuit 120 is a dual port memory allowing accesses by two requestors at a time. In other cases, central queue buffer circuit 120 is a single port memory allowing accesses by only one requestor at a time. In various cases, a write after read access is used to increase the usage of a single port implementation.

Data sets previously processed by data detector circuit 105 are decoded by non-binary decoder circuit 150. Non-binary decoder circuit 150 applies a non-binary decoding algorithm to the received data set. In some cases, the non-binary decoding algorithm is a low density parity check algorithm designed to operate on non-binary symbols. In operation, non-binary decoder circuit 150 loads a data set 123 from central queue buffer circuit 120 into one of a ping memory 135 or a pong memory 140 included as part of a ping/pong memory circuit 130. At the same time, non-binary decoder circuit 150 applies the non-binary decoding algorithm to a data set 143 that was previously stored to the other of ping memory 135 or pong memory 140. As the non-binary decoding algorithm is processing, results in the form of a data set 146 are written to the one of the ping memory 135 or pong memory 140 holding the data that is currently being decoded. Where the decoding process fails to converge, non-binary decoder circuit 150 causes the decoded data set 146 from ping-pong memory circuit 130 to be written to central queue circuit 120 as a data set 126.

Data set 126 may then be pulled from central queue buffer circuit 120 as a data set 163 that is provided to a symbol constrained shuffle circuit 160. Symbol constrained shuffle circuit 160 reverses the shuffling that was applied by symbol constrained de-shuffle circuit 115. Symbol constrained shuffle circuit 160 provides a resulting shuffled output 166 to data detector circuit 105. Data detector circuit 105 applies a data detection algorithm to the combination of shuffled output 166 and the corresponding data set 187 from Y-sample buffer circuit 185. The resulting output is provided as detected output 113.

The shuffling applied by symbol constrained shuffle circuit 160 involves rearranging the order of data set 163. It has been determined that non-binary symbols included within a data set provide a valuable tool in mitigating the effects of localized data corruption. Thus, in some embodiments of the present invention, the shuffling performed by symbol constrained shuffle circuit 160 is done on a non-binary symbol by symbol basis (i.e., the integrity of the non-binary symbols within the data set is maintained by assuring that bits corresponding to the same symbol are not separated during the shuffling process). Such an approach maintains the symbol integrity of the shuffled data, allowing data detector circuit 105 to rely on the symbols to enhance error recovery.

Examples of such symbol constrained shuffling are graphically presented in relation to FIGS. 6-7. Turning to FIG. 6, a graphic 600 depicts an example of the symbol constrained shuffle process. In particular, a non-shuffled data set 610 includes a number of binary values ($b_0$, $b_1$, $b_2$, $b_3$, $b_4$, $b_5$ ... $b_{n-3}$, $b_{n-2}$, $b_{n-1}$, $b_n$). In some cases, non-shuffled data set includes between five hundred and several thousand data bits. In this example, the bits are assembled into two bit symbols ($S_0$, $S_1$, $S_2$ ... $S_{n-1}$, $S_n$). A shuffled data set 620 is shown where bits corresponding to the symbols are rearranged without separating the two bit symbols. In particular, bits $b_{n-1}$, $b_n$ corresponding to symbol $S_n$ are maintained together but moved to a different location in the data set, bits $b_0$, $b_1$ corresponding to symbol $S_0$ are maintained together but moved to a different location in the data set, bits $b_0$, $b_1$ corresponding to symbol $S_0$ are maintained together but moved to a different location in the data set, bits $b_{n-3}$, $b_{n-2}$ corresponding to symbol $S_{n-1}$ are maintained together but moved to a different location in the data set, bits $b_2$, $b_3$ corresponding to symbol $S_1$ are maintained together but moved to a different location in the data set, and bits $b_4$, $b_5$ corresponding to symbol $S_2$ are maintained together but moved to a different location in the data set.

Turning to FIG. 7, a graphic 700 depicts an example of the symbol constrained shuffle process. In particular, a non-shuffled data set 710 includes a number of binary values ($b_0$, $b_1$, $b_2$, $b_3$, $b_4$, $b_5$ ... $b_{n-5}$, $b_{n-4}$, $b_{n-3}$, $b_{n-2}$, $b_{n-1}$, $b_n$). Again, in some cases non-shuffled data set includes between five hundred and several thousand data bits. In this example, the bits are assembled into three bit symbols ($S_0$, $S_1$ ... $S_{n-1}$, $S_n$). A shuffled data set 720 is shown where bits corresponding to the symbols are rearranged without separating the three bit symbols. In particular, bits $b_{n-5}$, $b_{n-4}$, $b_{n-3}$ corresponding to symbol $S_{n-1}$ are maintained together but moved to a different location in the data set, bits $b_3$, $b_4$, $b_5$ corresponding to symbol $S_1$ are maintained together but moved to a different location in the data set, bits $b_{n-2}$, $b_{n-1}$, $b_n$ corresponding to symbol $S_n$ are maintained together but moved to a different location in the data set, and bits $b_0$, $b_1$, $b_2$ corresponding to symbol $S_1$ are maintained together but moved to a different location in the data set. Again, while FIGS. 6-7 show examples using two bit and three bit, respectively, other symbol lengths are possible.

Alternatively, where the processing of the data set maintained in ping-pong memory 130 converges, the converged data is written out to one of hard decision memory circuit 170 as a data set 153. The data set maintained in hard decision memory circuit 170 is provided as a data set 173 to a symbol constrained shuffle circuit 175. Symbol constrained shuffle circuit 175 operates similar to the previously described symbol constrained shuffle circuit 160 to yield a shuffled output 178 to a codeword reorder circuit 180.

Data processing circuit 100 allows for performance of a variable number of local and global iterations through data detector circuit 105 and non-binary decoder circuit 150 depending upon the introduced data. A codeword reorder circuit 180 receives any out of order codewords as data sets 178, and reorders the data sets prior to providing them as a data output 183.

Figure 2:
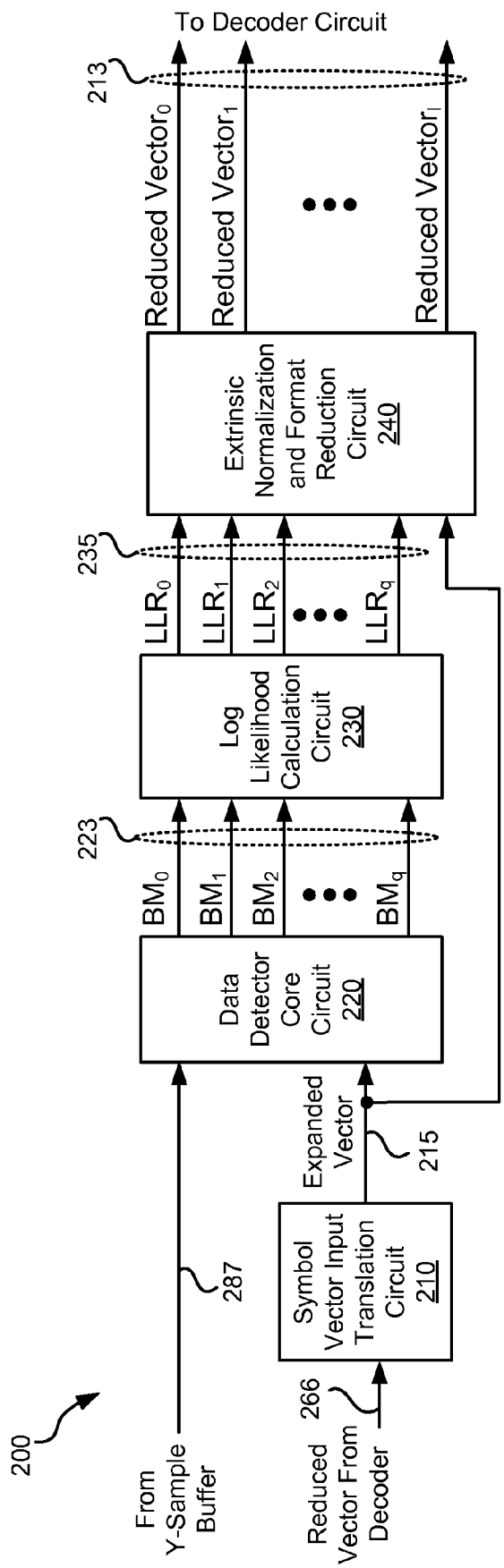
FIG. 2 depicts a format enhanced data detecting circuit in accordance with some embodiments of the present invention.

Turning to FIG. 2, a format enhanced data detecting circuit 200 is shown in accordance with some embodiments of the present invention. Format enhanced data detecting circuit 200 may be use in place of data detector circuit 105 of FIG. 1. Data detecting circuit 200 receives a data input 287 from a Y-sample buffer (not shown), a reduced vector 266 from a data decoder circuit (not shown), and provides a reduced vector 213. In the case where data detecting circuit 200 is used in place of data detector circuit 105, data input 287 corresponds to data sets 187, reduced vector 266 corresponds to shuffled output 166, and reduced vector 213 corresponds to detected output 113. Format enhanced data detecting circuit 200 allows for transferring detected outputs and decoded outputs to/from a data detector circuit in a reduced format that saves circuit area.

Reduced vector 266 is provided to a symbol vector translation circuit 210. Symbol vector translation circuit 210 translates reduced vector 266 into an expanded vector 215. The format of expanded vector 215 is as follows:

$$EV_i = \{L0_i, L1_i, \ldots LN_i\},$$

where i indicates the instance of expanded vector 215 (i.e., the particular data element of a codeword), and L0-LN are soft decision data corresponding to each possible value of a corresponding symbol. For example, where two bit symbols are used, there are four possible values for a symbol (i.e., '00', '01', '10', '11'). In such a case, expanded vector 215 includes four soft decision values (L0 corresponding to a likelihood that '00' is the appropriate hard decision, L1 corresponding to a likelihood that '01' is the appropriate hard decision, L2 corresponding to a likelihood that '10' is the appropriate hard decision, and L3 corresponding to a likelihood that '11' is the appropriate hard decision). Thus, expanded vector 215 is of the form:

$$EV_i = \{L0_i, L1_i, L3_i\}.$$

As another example, where three bit symbols are used, there are eight possible values for the symbol (i.e., '000', '001', '010', '011', '100', '101', '110', '111'). In such a case, expanded vector 215 includes eight soft decision values (L0 corresponding to a likelihood that '000' is the appropriate hard decision, L1 corresponding to a likelihood that '001' is the appropriate hard decision, L2 corresponding to a likelihood that '010' is the appropriate hard decision, L3 corresponding to a likelihood that '011' is the appropriate hard decision, L4 corresponding to a likelihood that '100' is the appropriate hard decision, L5 corresponding to a likelihood that '101' is the appropriate hard decision, L6 corresponding to a likelihood that '110' is the appropriate hard decision, L7 corresponding to a likelihood that '111' is the appropriate hard decision). Thus, expanded vector 215 is of the form:

$$EV_i = \{L0_i, L1_i, L3_i, L5_i, L6_i, L7_i\}.$$

The reduced vector is provided in the following format:

$$RVi = \{HD_i, L[A]_i, L[B]_i, \ldots L[N]_i\},$$

where i indicates the instance of reduced vector 266 (i.e., the particular data element of a codeword), and L[A]-L[N] correspond to soft decision data corresponding to each of the values of the symbol that were not selected as the hard decision (HD). For example, where two bit symbols are used, there are four possible values for a symbol (i.e., '00', '01', '10', '11'). In such a case, reduced vector 266 includes the hard decision and three soft decision values. In particular, if HD is '00' then the three soft decision values corresponding to normalized values of the likelihood of selecting HD as '01', '10' and '11', respectively. Alternatively, if HD is '01' then the three soft decision values correspond to normalized values of the likelihood of selecting HD as '00', '10' and '11', respectively; if HD is '10' then the three soft decision values correspond to normalized values of the likelihood of selecting HD as '00', '01' and '11', respectively; and if HD is '11' then the three soft decision values correspond to normalized values of the likelihood of selecting HD as '00', '01' and '10', respectively. Thus, reduced vector 266 is of the form:

$$RV_i = \{HD_i, L[A]_i, L[B]_i, L[C]_i\}.$$

As another example, where three bit symbols are used, there are eight possible values for the symbol (i.e., '000', '001', '010', '011', '100', '101', '110', '111'). In such a case, reduced vector 266 includes the HD and seven soft decision values. In particular, if HD is '000' then the seven soft decision values correspond to normalized values of the likelihood of selecting HD as '001', '010', '011', '100', '101', '110' and '111', respectively. Alternatively, if HD is '001' then the seven soft decision values correspond to normalized values of the likelihood of selecting HD as '000', '010', '011', '100', '101', '110' and '111', respectively; if HD is '010' then the seven soft decision values correspond to normalized values of the likelihood of selecting HD as '000', '001', '011', '100', '101', '110' and '111', respectively; if HD is '011' then the seven soft decision values correspond to normalized values of the likelihood of selecting HD as '000', '001', '010', '100', '101', '110' and '111', respectively; if HD is '100' then the seven soft decision values correspond to normalized values of the likelihood of selecting HD as '000', '001', '010', '011', '101', '110' and '111', respectively; if HD is '101' then the seven soft decision values correspond to normalized values of the likelihood of selecting HD as '000', '001', '010', '011', '100', '110' and '111', respectively; if HD is '110' then the seven soft decision values correspond to normalized values of the likelihood of selecting HD as '000', '001', '010', '011', '100', '101' and '111', respectively; and if HD is '111' then the seven soft decision values correspond to normalized values of the likelihood of selecting HD as '000', '001', '010', '011', '100', '101' and '110', respectively. Thus, reduced vector 266 is of the form:

$$RV_i = \{HD_i, L[A]_i, L[B]_i, L[C]_i, L[D]_i, L[E]_i, L[F]_i, L[G]_i\}.$$

Figure 3:
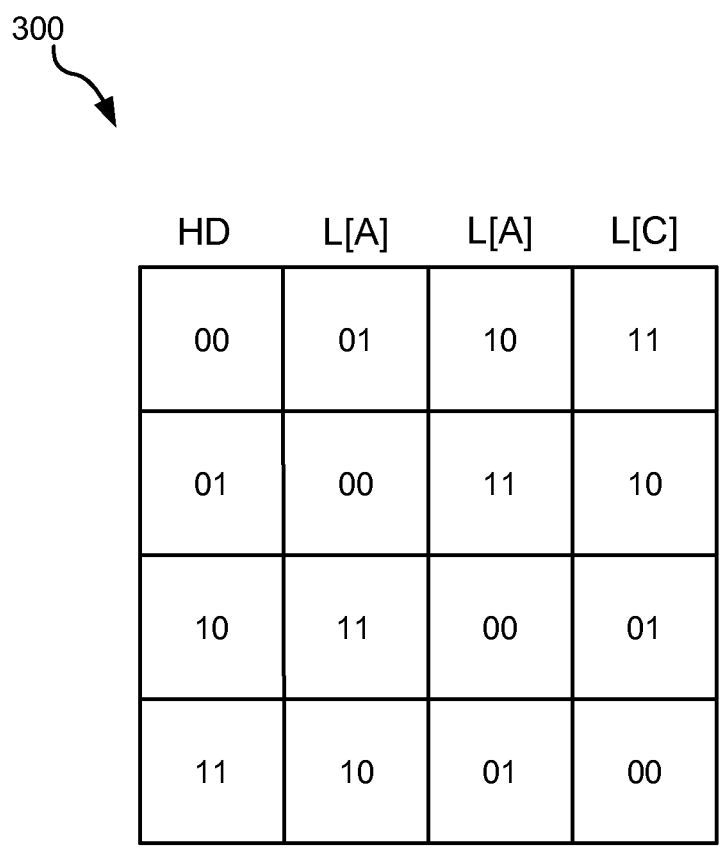
FIG. 3 depicts a reduced data transfer formatting map that may be used in relation to different embodiments of the present invention.

Symbol vector input translation circuit 210 operates to recreate the normalized likelihood values expected in expanded vector 215. Using an example where two bit symbols are represented by HD, (i.e., where HD, can be one of four symbols), the following pseudocode represents the recreation of expanded vector 215 from reduced vector 266 based upon a translation table 300 of FIG. 3:

```
IF(HD_i = '00')
{
    L0_i = 0;
    L1_i = L[A];
    L2_i = L[B];
    L3_i = L[C]
}
ELSE IF(HD_i = '01')
{
    L0_i = L[A];
    L1_i = 0;
    L2_i = L[C];
    L3_i = L[B]
}
ELSE IF(HD_i = '10')
{
    L0_i = L[B];
    L1_i = L[C];
    L2_i = 0;
    L3_i = L[A]
}
ELSE IF(HD_i = '11')
{
    L0_i = L[C];
    L1_i = L[B];
    L2_i = L[A];
    L3_i = 0
}
```

The resulting expanded vector 215 is then provided as:

$$EV_i = \{L0_i, L1_i, L2_i, L3_i\}.$$

As previously suggested, the process can be expanded to handle translation of vectors where HD, represents a symbol of three or more bits.

Expanded vector 215 and data input 287 are provided to a data detector core circuit 220. Data detector core circuit 220 applies a data detection algorithm on data input 287 using soft information (i.e., likelihood data) provided from expanded vector 215. On the first global iteration processing data input 287, the data for expanded vector 215 is set equal to zero. Data detector core circuit 220 may apply any data detection algorithm known in the art that produces branch metric values 223 (i.e., $BM_0$-$BM_q$). As some examples, data detector core circuit 220 may apply a maximum a posteriori data detection algorithm or a Viterbi data detection algorithm. Based upon the disclosure provided herein, one of ordinary skill in the art will recognize a variety of data detector algorithms known in the art. Branch metric outputs 223 are provided to a log likelihood calculation circuit 230 that calculates the likelihood of each of branch metric outputs 223 yielding a number of log likelihood ratio values 235. Log likelihood ratio values 235 correspond to the likelihood that each of the given branch metric values 223 indicate the correct symbols. Calculating the log likelihood ratios may be done as is known in the art. In one particular embodiment of the present invention, the log likelihood ratio is calculated in accordance with the following equation:

$$LLR(BM) = \text{Log}\left[\frac{\text{Probability of a Given } BM}{\text{Highest Probability of any } BM}\right].$$

These log likelihood ratio values are combined into expanded vectors by an extrinsic normalization and format reduction circuit 240 as follows:

$$EV'_i = \{L0'_i, L1'_i, \ldots LN'_i\},$$

where i indicates the instance of the expanded vector corresponding to a given symbol, and L0'-LN' correspond to the log likelihood ratios corresponding to a given symbol. For example, where two bit symbols are used, there are four possible values for a symbol (i.e., '00', '01', '10', '11'). In such a case, the expanded vector includes four soft decision values (L0' corresponding to a likelihood that '00' is the appropriate hard decision, L1' corresponding to a likelihood that '01' is the appropriate hard decision, L2' corresponding to a likelihood that '10' is the appropriate hard decision, and L3' corresponding to a likelihood that '11' is the appropriate hard decision). Thus, the expanded vector is of the form:

$$EV'_i = \{L0'_i, L1'_i, L2'_i, L3'_i\}.$$

In this case, one expanded vector is generated for each four log likelihood ratio values 235.

As another example, where three bit symbols are used, there are eight possible values for the symbol (i.e., '000', '001', '010', '011', '100', '101', '110', '111'). In such a case, expanded vector 215 includes eight soft decision values (L0' corresponding to a likelihood that '000' is the appropriate hard decision, L1' corresponding to a likelihood that '001' is the appropriate hard decision, L2' corresponding to a likelihood that '010' is the appropriate hard decision, L3' corresponding to a likelihood that '011' is the appropriate hard decision, L4' corresponding to a likelihood that '100' is the appropriate hard decision, L5' corresponding to a likelihood that '101' is the appropriate hard decision, L6' corresponding to a likelihood that '110' is the appropriate hard decision, L7' corresponding to a likelihood that '111' is the appropriate hard decision). Thus, the expanded vector is of the form:

$$EV'_i = \{L0'_i, L1'_i, L2'_i, L4'_i, L5'_i, L6'_i, L7'_i\}.$$

In this case, one expanded vector is generated for each eight log likelihood ratio values 235.

In addition, extrinsic normalization and format reduction circuit 240 subtracts expanded vector 215 from the corresponding expanded vector generated from the log likelihood data 235 from log likelihood calculation circuit in accordance with the following equations:

$$\text{Subtracted } EV_i \ (SEV) = EV - EV_i = \{L0'_i - L0_i, L1'_i - L1_i, \ldots LN'_i - LN_i\}.$$

For convenience, the subtracted values are indicated by double primes as follows:

$$L0''_i = L0'_i - L0_i;$$

$$L1''_i = L1'_i - L1_i;$$

$$L2''_i = L2'_i - L2_i; \text{ and}$$

$$L3''_i = L3'_i - L3_i.$$

Extrinsic normalization and format reduction circuit 240 then normalizes the subtracted, expanded vector outputs by subtracting the maximum L value from all of the L values as shown in the following equation:

$$\text{Normalized } EV_i(NEV) = \{L0''_i - L''\text{max}, L1''_i - L''\text{max}, \ldots LN''_i - L''\text{max}\}.$$

Thus, the L value corresponding to the maximum log likelihood ratio becomes zero, and all of the other values are normalized to the maximum L value. For example, where L0" is the maximum L value, it is subtracted from all other L values (e.g., L1' . . . LN'). Thus, the value in the L0" position is zero, and all others are normalized to the maximum.

The instances of normalized expanded vector (NEV) are then converted to the reduced vector format. The format conversion to the reduced format conversion includes providing a hard decision output corresponding to the maximum L value, and including the normalized and subtracted L values other than the maximum L value. Thus, for example, where two bit symbols are used, there are four possible values for a symbol (i.e., '00', '01', '10', '11'). In such a case, the normalized/subtracted expanded vector is represented as:

$$NEV=\{L0''_i-L''max, L1''_i-L''max, L2''_i-L''max, L3''_i-L''max,\}.$$

This normalized/subtracted expanded vector is converted to the reduced vector format represented as:

$$RV_i\{HD_i, L[A]_i, L[B]_i, L[C]_i\}.$$

where $HD_i$ is the symbol corresponding to the maximum L value [i.e., the maximum of $(L0''_i-L0_i)$, $(L1''_i-L1_i)$, $(L2''_i-L2_i)$ or $(L3''_i-L3_i)$]; and $L[A]$, $L[B]$, $L[C]$ correspond to a respective one of the non-maximum values of $(L0''_i-L0_i)$, $(L1''_i-L1_i)$, $(L2''_i-L2_i)$ or $(L3''_i-L3_i)$. In particular, the value of A in $L[A]$, the value of B in $L[B]$ and the value of C in $L[C]$ are calculated as a bitwise XOR with HD, in accordance with the following pseudocode that relies on the row and column information of a translation table 300 of FIG. 3:

```
IF(HD_i = '00')
{
    A = HD_i XOR '01';    /* i.e., (L1''_i- L1_i) is included as L[A] */
    B = HD_i XOR '10';    /* i.e., (L2''_i- L2_i) is included as L[B] */
    C = HD_i XOR '11'     /* i.e., (L3''_i- L3_i) is included as L[C] */
}
ELSE IF(HD_i = '01')
{
    A = HD_i XOR '01';    /* i.e., (L0''_i- L0_i) is included as L[A] */
    B = HD_i XOR '10';    /* i.e., (L3''_i- L3_i) is included as L[B] */
    C = HD_i XOR '11'     /* i.e., (L2''_i- L2_i) is included as L[C] */
}
ELSE IF(HD_i = '10')
{
    A = HD_i XOR '01';    /* i.e., (L3''_i- L3_i) is included as L[A] */
    B = HD_i XOR '10';    /* i.e., (L0''_i- L0_i) is included as L[B] */
    C = HD_i XOR '11'     /* i.e., (L1''_i- L1_i) is included as L[C] */
}
ELSE IF(HD_i = '11')
{
    A = HD_i XOR '01';    /* i.e., (L2''_i- L2_i) is included as L[A] */
    B = HD_i XOR '10';    /* i.e., (L1''_i- L1_i) is included as L[B] */
    C = HD_i XOR '11'     /* i.e., (L0''_i- L0_i) is included as L[C] */
}
```

This approach can be expanded to handle symbols of three or more bits.

The resulting reduced vectors are provided as reduced vector outputs 213. Where two bit symbols are employed, one reduced vector is created for each four log likelihood ratio values 235. Where three bit symbols are employed, one reduced vector is created for each eight log likelihood ratio values 235. These reduced vectors may be provided, for example, to a downstream data decoder circuit (not shown).

Figure 4:
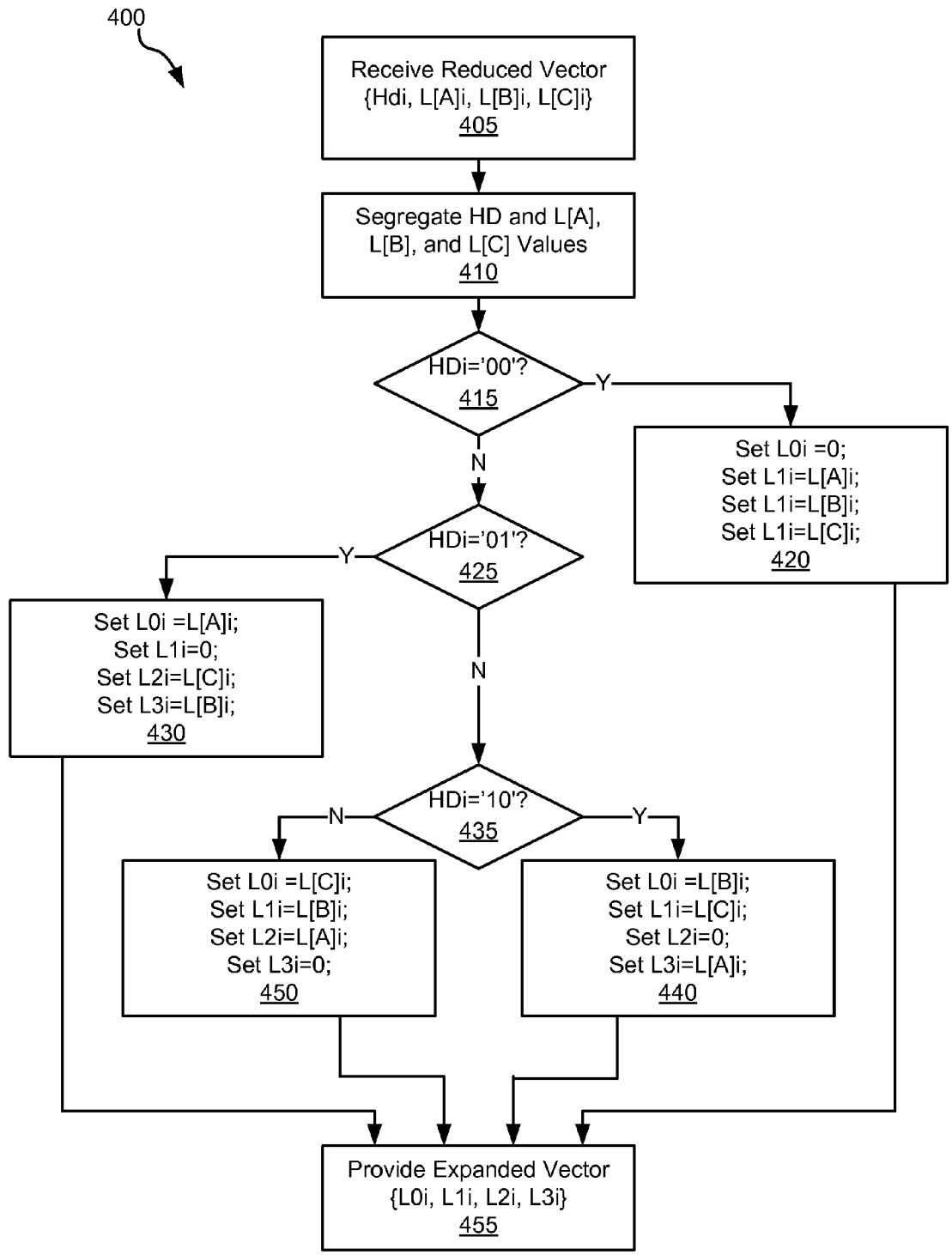
FIG. 4 is a flow diagram showing a reduced format to expanded format translation process in accordance with one or more embodiments of the present invention.

Turning to FIG. 4 a flow diagram 400 shows a reduced format to expanded format translation process in accordance with one or more embodiments of the present invention. Following flow diagram 400, a reduced vector is received (block 405). Where two bit symbols are represented there are four possible values for the symbol (i.e., '00', '01', '10', '11'), and the reduced vector is in the form of $RV_i=\{HD_i, L[A]_i, L[B]_i, L[C]_i\}$, where $HD_i$ represents the two bit symbol corresponding to the highest log likelihood ratio (i.e., L value), and $L[A]_i$, $L[B]_i$ and $L[C]_i$ correspond to the log likelihood ratios (i.e., soft decision data) for the three values of the two bit symbol that were not selected as $HD_i$. The reduced vector may be received, for example, from a data decoder circuit, a memory, or a de-shuffling circuit as were more fully discussed above in relation to FIG. 1. It should be noted that while flow diagram 400 is described with reference to two bit symbols that the same process can be expanded for use in relation to symbols of three or more bits.

The hard decision (i.e., $HD_i$) and log likelihood information (i.e., $L[A]_i$, $L[B]_i$, $L[C]_i$) from the reduced vector are segregated for use in conversion to an expanded vector (block 410). It is determined whether the hard decision is '00' (block 415). Where the hard decision is '00' (block 415), the values of $L0_i$, $L1_i$, $L2_i$, $L3_i$ are assigned values as follow:

$L0_i=0$;

$L1_i=L[A]_i$;

$L2_i=L[B]_i$; and $L3_i=L[C]_i$ (block 420). Otherwise, where the hard decision is not '00' (block 415), it is determined whether the hard decision is '01' (block 425). Where the hard decision is '01' (block 425), the values of $L0_i$, $L1_i$, $L2_i$, $L3_i$ are assigned values as follow:

$L0_i=L[A]_i$;

$L1_i=0$;

$L2_i=L[C]_i$; and $L3_i=L[B]_i$ (block 430). Otherwise, where the hard decision is not '01' (block 425), it is determined whether the hard decision is '10' (block 435). Where the hard decision is '10' (block 435), the values of $L0_i$, $L1_i$, $L2_i$, $L3_i$ are assigned values as follow:

$L0_i=L[B]_i$;

$L1_i=L[C]$;

$L2_i=0$; and $L3_i=L[A]_i$ (block 440). Otherwise, where the hard decision is not '10' (block 435), the values of $L0_i$, $L1_i$, $L2_i$, $L3_i$ are assigned values as follow:

$L0_i=L[C]_i$;

$L1_i=L[B]$;

$L2_i=L[A]$; and $L3_i=0$ (block 450). These assigned values are assembled into an expanded vector with the format:

$$\{L0_i, L1_i, L_{2i}, L3_i\}.$$

Figure 5A:
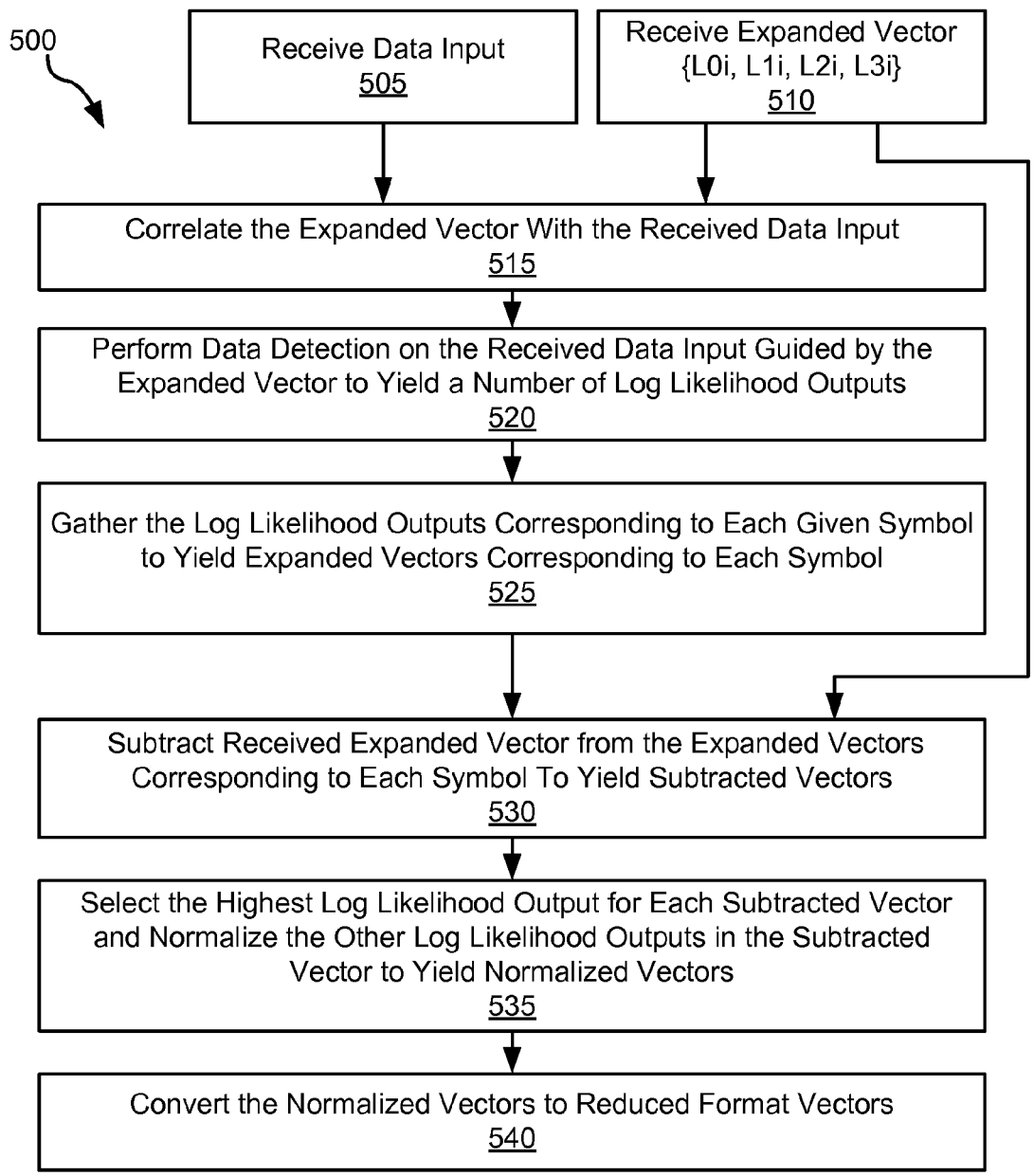
FIG. 5a is a flow diagram showing a process of performing data detection based on reduced format vectors in accordance with one or more embodiments of the present invention.

Turning to FIG. 5a, a flow diagram 500 shows a process of performing data detection based on reduced format vectors in accordance with one or more embodiments of the present invention. Following flow diagram 500, a data input is received (block 505). The data input includes a series of bits that represent a corresponding series of symbols. The symbols may include two or more bits depending upon the particular implementation. Thus, while flow diagram 500 is described with reference to two bit symbols that the same process can be expanded for use in relation to symbols of three or more bits. In addition, an expanded vector is received (block 510). The expanded vector is in the form of $\{L0_i, L1_i,$ $L2_i, L3_i$}, and includes soft decision data corresponding to the data input that was derived, for example, from a previous data decoding process. The received data is correlated with the expanded vector (block 515). This includes correlating the soft decision information in the expanded vector with corresponding symbols in the received data.

A data detection algorithm is then applied to the received data using the soft decision in the expanded vector to guide or influence the data detection process (block 520). This data detection process may be any data detection process known in the art that is capable of being guided by previously developed soft decision information. As some examples, the data detection process may be a Viterbi algorithm data detection or a maximum a posteriori data detection. Based upon the disclosure provided herein, one of ordinary skill in the art will recognize a variety of data detection processes that may be used in relation to different embodiments of the present invention. The data detection process yields a number of log likelihood outputs indicating the likelihood of particular values for each symbol.

The log likelihood outputs corresponding to each symbol are assembled together into expanded vectors (block 525). For example, where two bit symbols are used, four log likelihood outputs corresponding to the four possible values of the two bit symbol are gathered together into an expanded vector with the format $\{L0'_i, L1'_i, L2'_i, L3'_i\}$. As another example, where three bit symbols are used, eight log likelihood outputs corresponding to the eight possible values of the two bit symbol are gathered together into an expanded vector with the format $\{L0'_i, L1'_i, L2'_i, L3'_i, L4'_i, L5'_i, L6'_i, L7'_i\}$. The expanded vector originally received is subtracted from the expanded vector generated as part of the data detection process (block 530). Using the two bit symbol example, the subtraction is performed in accordance with the following equation:

$$SEV=\{(L0'_i-L0_i), (L1'_i-L1_i), (L2'_i-L2_i), (L3'_i-L3_i)\},$$

where SEV stands for subtracted, expanded vector. The resulting subtracted values may be represented by the following symbols for simplicity:

$$L0''_i=(L0'_i-L0_i);$$

$$L1''_i=(L1'_i-L1_i);$$

$$L2''_i=(L2'_i-L2_i); \text{ and}$$

$$L3''_i=(L3'_i-L3_i).$$

The highest of $L0''_i, L1''_i, L2''_i$, and $L3''_i$, is identified and the remaining likelihood values are normalized to this identified value to yield normalized vectors (block 535). The normalization is done by subtracting the identified highest value from each of the other values in accordance with the following equation:

$$\text{Normalized } EV_i(NEV)=\{L''_i-L''\text{max}, L1''_i-L''\text{max}, L2''_i-L''\text{max}, L3''_i-L''\text{max}\},$$

where NEV stands for normalized, expanded vector. Then, the normalized, expanded vector is converted from the expanded vector format into a reduced vector format (block 540).

Figure 5B:
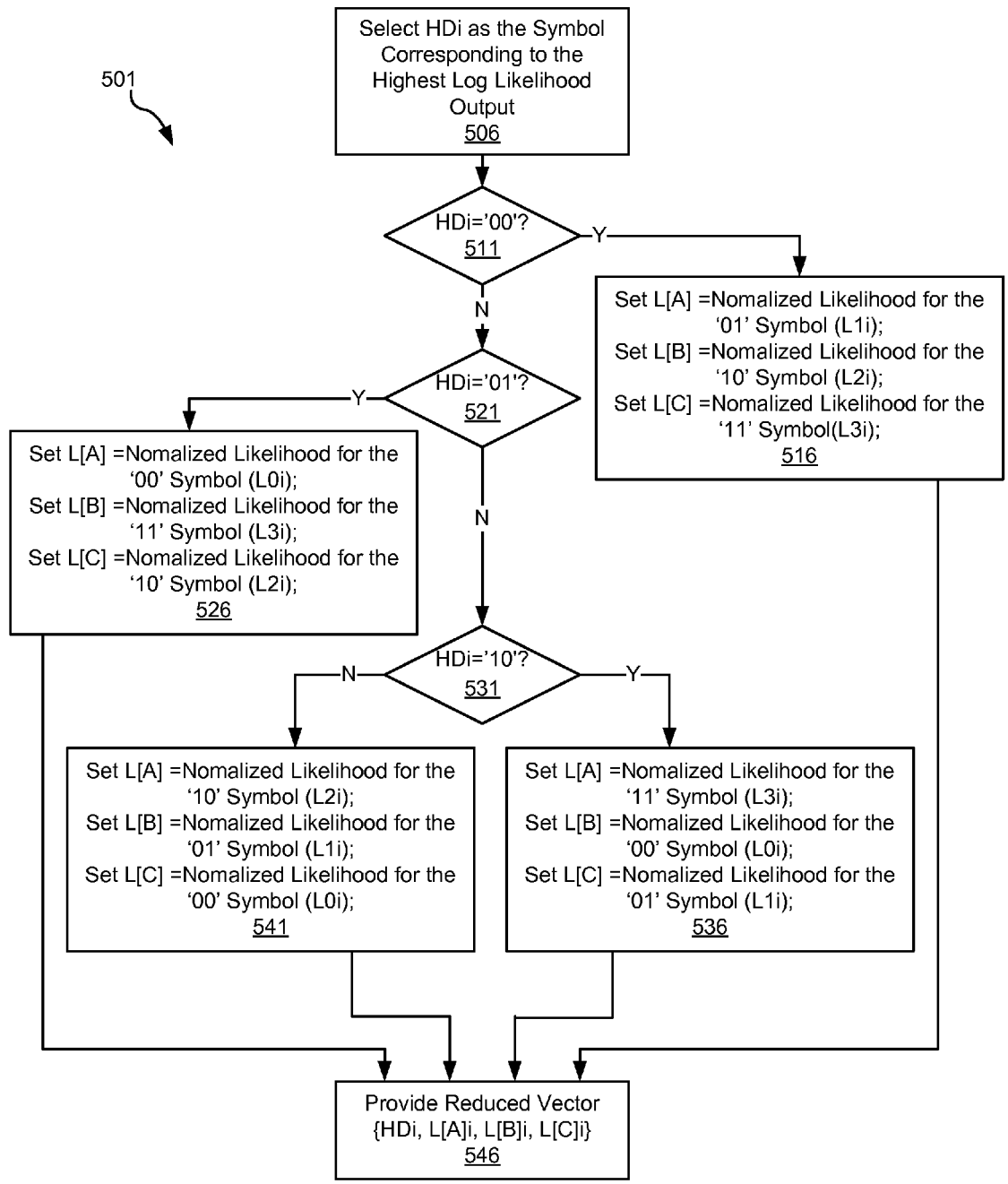
FIG. 5b is a flow diagram showing an expanded format to reduced format translation process in accordance with one or more embodiments of the present invention.

Turning to FIG. 5*b*, a flow diagram 501 shows a method for converting from the expanded format to the reduced format in accordance with one or more embodiments of the present invention. Following flow diagram 501, the symbol corresponding to the highest likelihood in the normalized, expanded vector is selected as the hard decision (HD,) (block 506). For example, where two bit symbols are used having four possible symbol values (i.e., '00', '01', '10', '11') and the likelihood that has the highest value is $L0''_i$, the '00' symbol is selected as the hard decision; where the likelihood that has the highest value is $L1''_i$, the '01' symbol is selected as the hard decision; where the likelihood that has the highest value is $L2''_i$, the '10' symbol is selected as the hard decision; and where the likelihood that has the highest value is $L3''_i$, the '11' symbol is selected as the hard decision.

It is determined whether $HD_i$ is '00' (block 511). Where $HD_i$ is '00' (block 511), the values of L[A], L[B], L[C] are assigned values as follow:

$$L[A]_i=L1''_i-L''\text{max};$$

$$L[B]_i=L2'_i-L'\text{max}; \text{ and}$$

$$L[C]_i=L3''_i-L''\text{max}$$

(block 516). Otherwise, it is determined whether $HD_i$ is '01' (block 521). Where $HD_i$ is '01' (block 521), the values of L[A], L[B], L[C] are assigned values as follow:

$$L[A]_i=L0''_i-L''\text{max};$$

$$L[B]_i=L3'_i-L'\text{max}; \text{ and}$$

$$L[C]_i=L2''_i-L''\text{max}$$

(block 526). Otherwise, it is determined whether $HD_i$ is '10' (block 531). Where $HD_i$ is '10' (block 531), the values of L[A], L[B], L[C] are assigned values as follow:

$$L[A]_i=L3''_i-L''\text{max};$$

$$L[B]_i=L0'_i-L'\text{max}; \text{ and}$$

$$L[C]_i=L1''_i-L''\text{max}$$

(block 536). Otherwise, $HD_i$ is '11' and the values of L[A], L[B], L[C] are assigned values as follow:

$$L[A]_i=L2''_i-L''\text{max};$$

$$L[B]_i=L1'_i-L'\text{max}; \text{ and}$$

$$L[C]_i=L0''_i-L''\text{max}$$

(block 541). With the aforementioned values set, the values are assembled into a reduced vector with the format :

$$\{HD_i, L[A]_i, L[B]_i, L[C]_i\}$$

(block 546).

Figure 8:
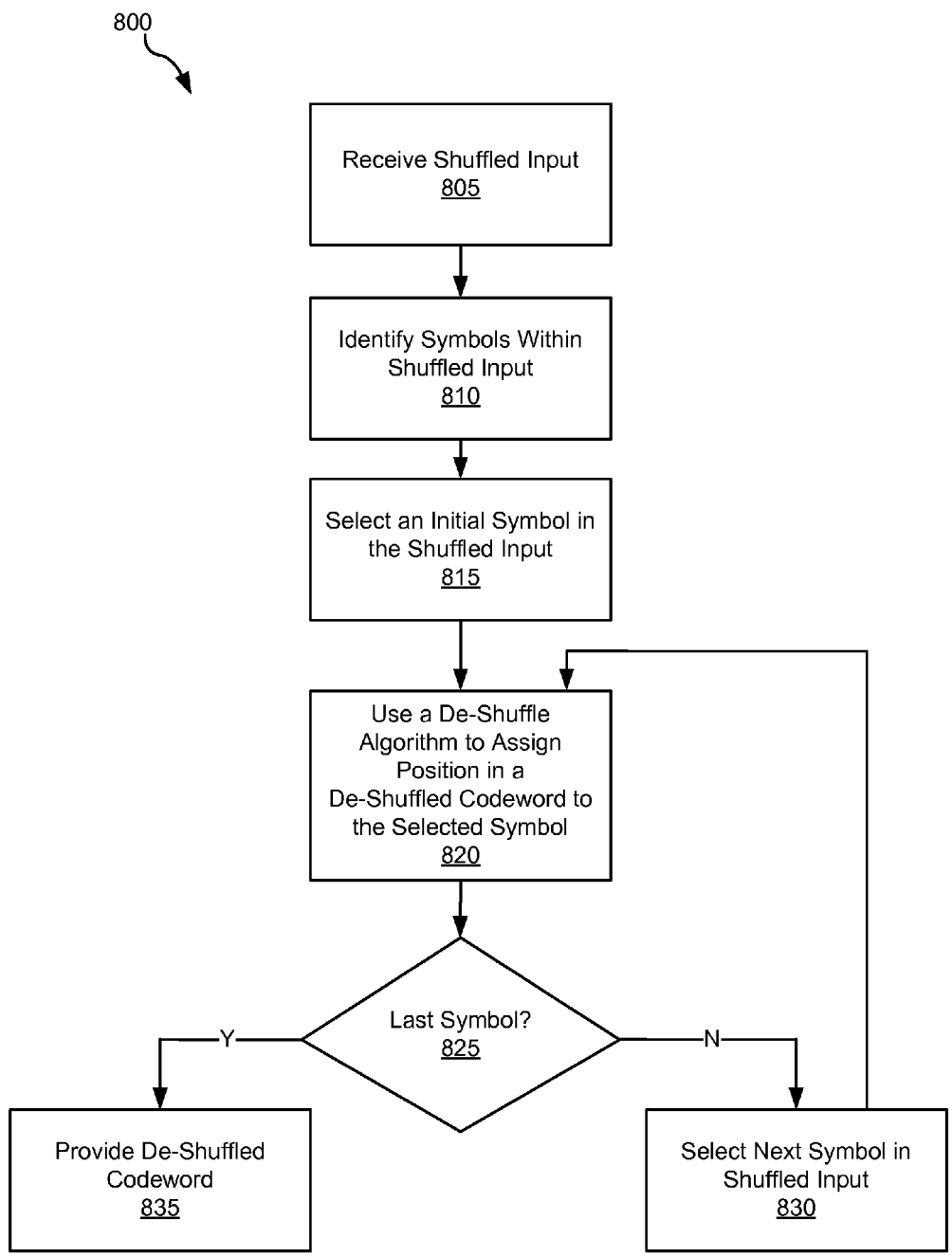
FIGS. 8-9 are flow diagrams showing methods in accordance with some embodiments of the present invention for performing symbol constrained shuffling and de-shuffling.

Turning to FIG. 8, a flow diagram 800 shows a method in accordance with some embodiments of the present invention for performing symbol constrained de-shuffling. Following flow diagram 800, a shuffled input is received (block 805). The shuffled input may be similar to that described above in relation to shuffled data set 620 of FIG. 6. The data set may have been shuffled after encoding and prior to transfer via, for example, a storage medium or a wireless transfer medium. Alternatively, the shuffled data set may have been shuffled after being processed by a data decoder circuit.

The sets of bits corresponding to symbols are identified (block 810). Using graphic 600 as an example, the bit pairs in shuffled data set 620 (i.e., $b_0$ and $b_1$, $b_2$ and $b_3$, $b_4$ and $b_5$, $b_{n-3}$ and $b_{n-2}$, and $b_{n-1}$ and $b_n$) are identified as respective inseparable symbols ($S_0$, $S_1$, $S_2$, $S_{n-1}$, and $S_n$). An initial one of the identified symbols is selected (block 815). This selected symbol is then moved to another location in a de-shuffled codeword in accordance with a de-shuffle algorithm (block 820). The de-shuffle algorithm may be a map that reverses the location of a symbol that was applied during a preceding shuffle process. It is determined whether the last symbol in the shuffled input has been processed (block 825). Where it is not the last symbol (block 825), the next symbol in the shuffled input is selected for processing (block 830), and the processes of blocks 820-825 are repeated for the next symbol. Alternatively, where it is the last symbol (block 825), the resulting de-shuffled codeword is provided (block 835). This de-shuffled codeword may be provided, for example, to a downstream data decoder circuit.

Figure 9:
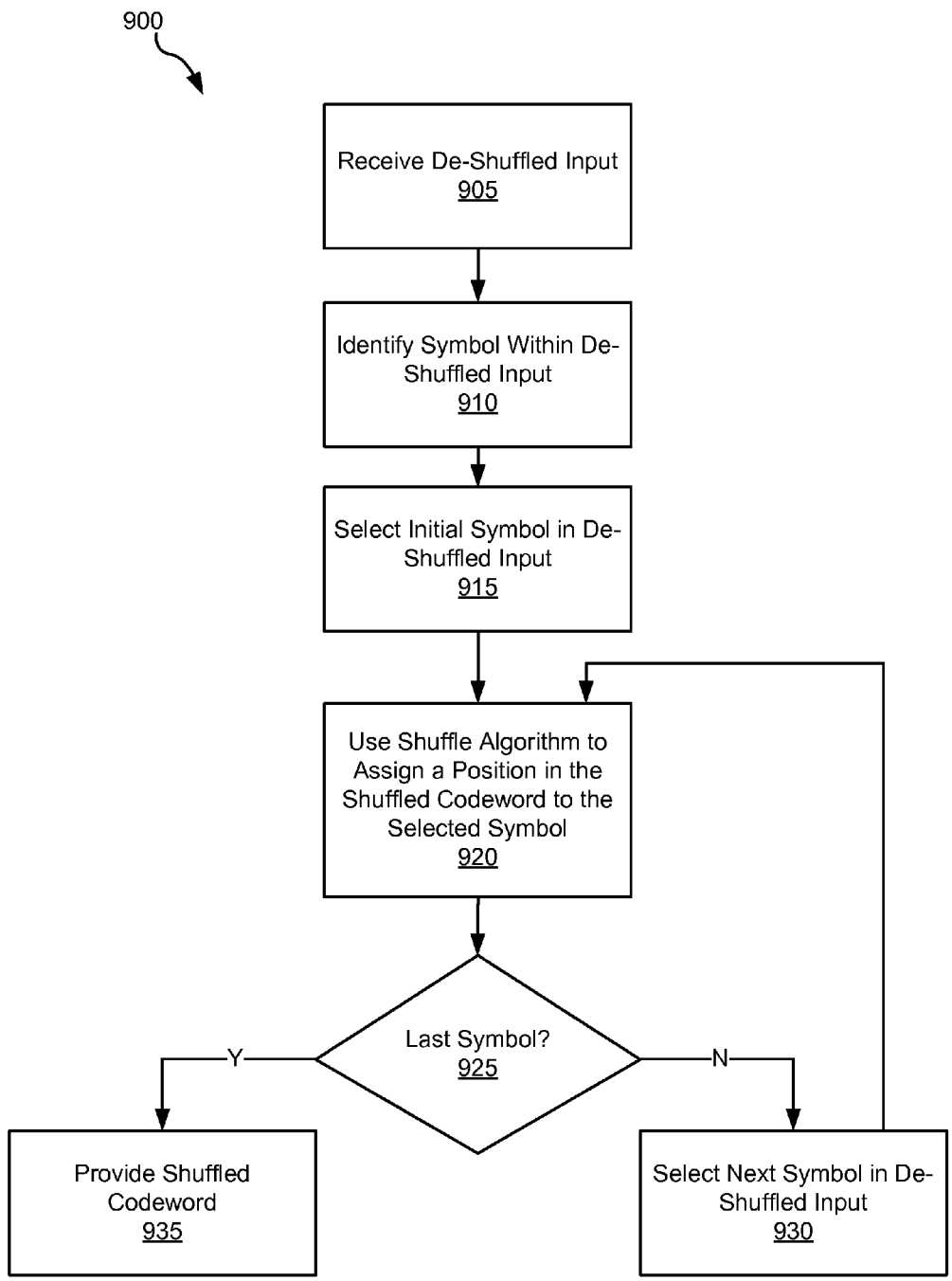

Turning to FIG. 9, a flow diagram 900 shows a method in accordance with some embodiments of the present invention for performing symbol constrained shuffling. Following flow diagram 900, a de-shuffled input is received (block 905). The de-shuffled input may be similar to that described above in relation to de-shuffled data set 610 of FIG. 6. The data set may have been de-shuffled prior to providing it to a data decoder circuit.

The sets of bits corresponding to symbols are identified (block 910). Using graphic 600 as an example, the bit pairs in de-shuffled data set 610 (i.e., $b_0$ and $b_1$, $b_2$ and $b_3$, $b_4$ and $b_5$, $b_{n-3}$ and $b_{n-2}$, and $b_{n-1}$ and $b_n$) are identified as respective inseparable symbols ($S_0$, $S_1$, $S_2$, $S_{n-1}$, and $S_n$). An initial one of the identified symbols is selected (block 915). This selected symbol is then moved to another location in a shuffled codeword in accordance with a shuffle algorithm (block 920). The shuffle algorithm may be a map that sets forth a location of a symbol within a shuffled codeword. The shuffle algorithm is the reverse of the de-shuffle algorithm. It is determined whether the last symbol in the de-shuffled input has been processed (block 925). Where it is not the last symbol (block 925), the next symbol in the de-shuffled input is selected for processing (block 930), and the processes of blocks 920-925 are repeated for the next symbol. Alternatively, where it is the last symbol (block 925), the resulting shuffled codeword is provided (block 935). This shuffled codeword may be provided, for example, to a data detector circuit.

Figure 10:
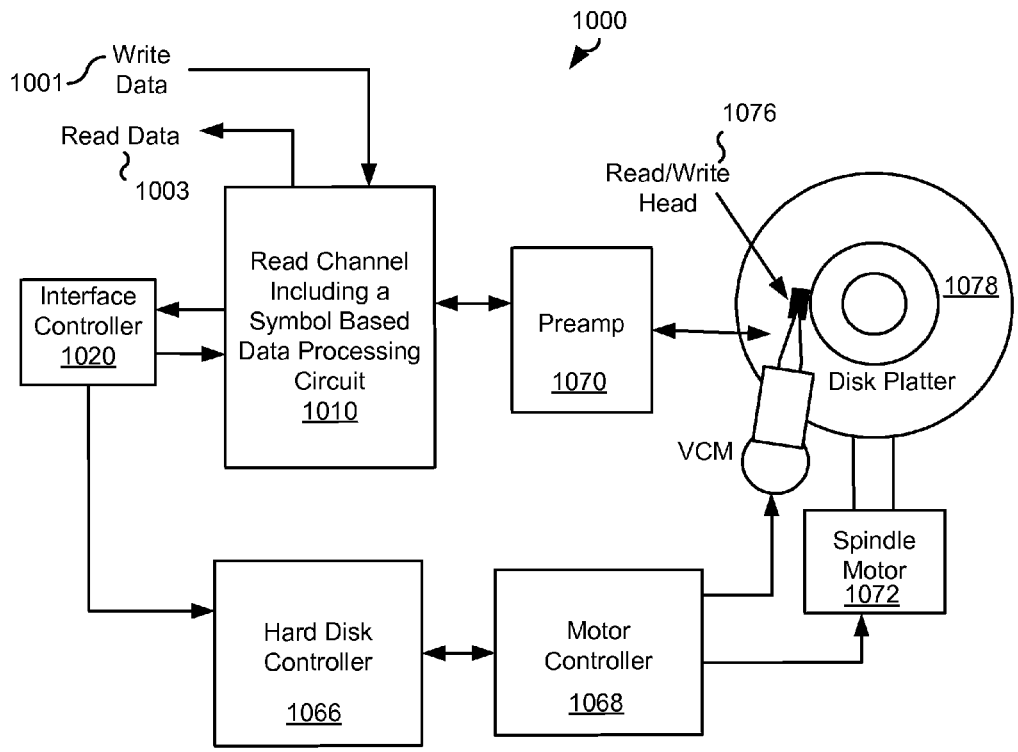
FIG. 10 shows a storage system including a read channel module with a symbol based data processing circuit in accordance with various embodiments of the present invention.

Turning to FIG. 10, a storage system 1000 including a read channel circuit 1010 with a symbol based data processing circuit in accordance with various embodiments of the present invention. Storage system 1000 may be, for example, a hard disk drive. Storage system 1000 also includes a preamplifier 1070, an interface controller 1020, a hard disk controller 1066, a motor controller 1068, a spindle motor 1072, a disk platter 1078, and a read/write head 1076. Interface controller 1020 controls addressing and timing of data to/from disk platter 1078. The data on disk platter 1078 consists of groups of magnetic signals that may be detected by read/write head assembly 1076 when the assembly is properly positioned over disk platter 1078. In one embodiment, disk platter 1078 includes magnetic signals recorded in accordance with either a longitudinal or a perpendicular recording scheme.

In a typical read operation, read/write head assembly 1076 is accurately positioned by motor controller 1068 over a desired data track on disk platter 1078. Motor controller 1068 both positions read/write head assembly 1076 in relation to disk platter 1078 and drives spindle motor 1072 by moving read/write head assembly to the proper data track on disk platter 1078 under the direction of hard disk controller 1066. Spindle motor 1072 spins disk platter 1078 at a determined spin rate (RPMs). Once read/write head assembly 1078 is positioned adjacent the proper data track, magnetic signals representing data on disk platter 1078 are sensed by read/write head assembly 1076 as disk platter 1078 is rotated by spindle motor 1072. The sensed magnetic signals are provided as a continuous, minute analog signal representative of the magnetic data on disk platter 1078. This minute analog signal is transferred from read/write head assembly 1076 to read channel 1010 via preamplifier 1070. Preamplifier 1070 is operable to amplify the minute analog signals accessed from disk platter 1078. In turn, read channel circuit 1010 decodes and digitizes the received analog signal to recreate the information originally written to disk platter 1078. This data is provided as read data 1003 to a receiving circuit. As part of processing the received information, read channel circuit 1010 performs a symbol based data processing. Such a symbol based data processing may utilize a format enhanced detecting circuit such as that described above in relation to FIG. 2, and/or may operate similar to that described above in relation to FIGS. 3-5. Alternatively, or in addition, read channel circuit 1010 may perform a symbol based internal data decoding such as that described in relation to FIG. 1 above, and/or may operate similar to that described in relation to FIGS. 6-9 above. A write operation is substantially the opposite of the preceding read operation with write data 1001 being provided to read channel circuit 1010. This data is then encoded and written to disk platter 1078.

It should be noted that storage system 1000 may be integrated into a larger storage system such as, for example, a RAID (redundant array of inexpensive disks or redundant array of independent disks) based storage system. It should also be noted that various functions or blocks of storage system 1000 may be implemented in either software or firmware, while other functions or blocks are implemented in hardware.

Figure 11:
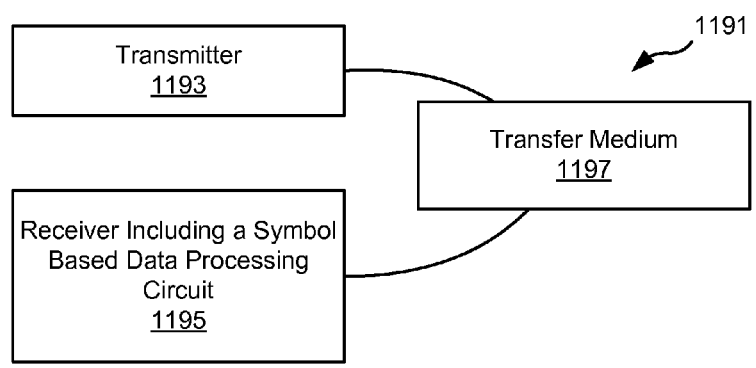
FIG. 11 depicts a data transmission system including a receiver with a symbol based data processing circuit in accordance with various embodiments of the present invention.

Turning to FIG. 11, a data transmission system 1100 including a receiver 1195 with a symbol based data processing circuit is shown in accordance with different embodiments of the present invention. Data transmission system 1100 includes a transmitter 1193 that is operable to transmit encoded information via a transfer medium 1197 as is known in the art. The encoded data is received from transfer medium 1197 by receiver 1195. Receiver 1195 incorporates the a symbol based data processing circuit. Such an optimized a symbol based data processing circuit may utilize a format enhanced data detecting circuit such as that described above in relation to FIG. 2, and/or may operate similar to that described above in relation to FIGS. 3-5. Alternatively, or in addition, read channel circuit 1010 may perform a symbol based internal data decoding such as that described in relation to FIG. 1 above, and/or may operate similar to that described in relation to FIGS. 6-9 above.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for performing data processing. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscriber line systems. Therefore, the above description should not be taken as limiting the scope of the invention, which is defined by the appended claims.

What is claimed is:

1. A data processing circuit, the circuit comprising:
a data detector circuit operative to apply a data detection algorithm to a combination of a first input data set and a decoded data set to yield a detected output, wherein the detected output includes a number of non-binary symbols;
a first symbol constrained arrangement circuit operative to receive the detected output and to re-arrange the detected output in accordance with a first arrangement algorithm to yield a re-arranged output, wherein the bits for at least one non-binary symbol from the detected output are maintained together in the re-arranged output; and
a second symbol constrained arrangement circuit operative to receive a second input data set and to re-arrange the second data input in accordance with a second arrangement algorithm to yield the decoded data set, wherein the bits for at least one non-binary symbol from the second input data set are maintained together in the decoded data set output.

2. The circuit of claim 1, wherein the circuit is implemented as part of an integrated circuit.

3. The circuit of claim 1, wherein the circuit is implemented as part of a device selected from a group consisting of: a storage device, and a wireless data transfer device.

4. The circuit of claim 3, wherein the storage device is a hard disk drive.

5. The circuit of claim 1, wherein the first arrangement algorithm is the inverse of the second arrangement algorithm.

6. The circuit of claim 1, wherein the first arrangement algorithm is the inverse of a third arrangement algorithm applied to yield the first input data set.

7. The circuit of claim 1, wherein the data detection algorithm is selected from a group consisting of: a Viterbi algorithm data detection algorithm, and a maximum a posteriori data detection algorithm.

8. The circuit of claim 1, wherein the circuit further comprises:
a data decoder circuit operative to apply a data decoding algorithm to the re-arranged output to yield the second input data set.

9. The circuit of claim 8, wherein the data decoding algorithm is a non-binary data decoding algorithm tailored for the non-binary symbols.

10. The circuit of claim 9, wherein the non-binary symbols are selected from a group consisting of: two bit symbols, and three bit symbols.

11. A method for data processing, the method comprising:
receiving a first data input having at least a first non-binary symbol;
receiving a second data input having at least a second non-binary symbol, wherein the second non-binary symbol corresponds to the first non-binary symbol;
re-arranging the second data input according to a second arrangement algorithm to yield a decoded data set, wherein the bits of the second non-binary symbol are placed together in the decoded data set;
applying a data detection algorithm by a data detector circuit to the first data input and the decoded data set to yield a detected output, wherein the detected output includes the first non-binary symbol; and
re-arranging the detected output according to a first arrangement algorithm to yield a re-arranged output, wherein the bits of the first non-binary symbol are placed together in the re-arranged output.

12. The method of claim 11, wherein the method further comprises:
applying a decoding algorithm to the re-arranged output to yield the second data input.

13. The method of claim 11, wherein the second arrangement algorithm is the inverse of the first arrangement algorithm.

14. A data processing system, the system comprising:
an analog front end circuit operative to receive an analog signal from a channel;
an analog to digital converter circuit operative to convert the analog signal into a series of digital samples;
an equalizer circuit operative to equalize the series of digital samples to yield a first input data set;
a data detector circuit operative to apply a data detection algorithm to a combination of a first input data set and a decoded data set to yield a detected output, wherein the detected output includes a number of non-binary symbols;
a first symbol constrained arrangement circuit operative to receive the detected output and to re-arrange the detected output in accordance with a first arrangement algorithm to yield a re-arranged output, wherein the bits for at least one symbol from the detected output are maintained together in the re-arranged output;
a second symbol constrained arrangement circuit operative to receive a second data input and to re-arrange the second data input in accordance with a second arrangement algorithm to yield the decoded data set, wherein the bits for at least one symbol from the second data set are maintained together in the re-arranged output; and
a data decoder circuit operative to apply a data decoding algorithm to the re-arranged output to yield the second input data set.

15. The system of claim 14, wherein the system is a storage device, and wherein the channel includes a magnetic storage medium.

16. The system of claim 14, wherein the system is a wireless data transfer device, and wherein the channel includes a wireless data transmission medium.

17. The system of claim 14, wherein the first arrangement algorithm is the inverse of the second arrangement algorithm.

18. The system of claim 14, wherein the first arrangement algorithm is the inverse of a third arrangement algorithm applied to yield the first input data set.

19. The system of claim 14, wherein the data detection algorithm is selected from a group consisting of: a Viterbi algorithm data detection algorithm, and a maximum a posteriori data detection algorithm.

20. The system of claim 14, wherein the data decoding algorithm is a non-binary data decoding algorithm tailored for the non-binary symbols.

* * * * *